United States Patent [19]

Nercessian

[11] 3,836,907

[45] Sept. 17, 1974

[54] DIGITAL TO ANALOG CONVERTER

[75] Inventor: Sarkis Nercessian, Long Island City, N.Y.

[73] Assignee: Forbro Design Corp., New York, N.Y.

[22] Filed: Mar. 21, 1973

[21] Appl. No.: 343,420

[52] U.S. Cl. ...................... 340/347 DA, 340/173 LT
[51] Int. Cl. ...................... H03k 13/02, G11c 11/42
[58] Field of Search ........ 340/347 DA, 173; 323/40; 84/1.18

[56] References Cited

UNITED STATES PATENTS

| | | | |
|---|---|---|---|
| 3,566,252 | 2/1971 | Nercessian | 323/1 |
| 3,609,713 | 9/1971 | Wooton et al. | 340/173 LM |
| 3,697,980 | 10/1972 | Boinodiris et al. | 340/347 DA |

*Primary Examiner*—Malcolm A. Morrison
*Assistant Examiner*—Vincent J. Sunderdick
*Attorney, Agent, or Firm*—Alfred W. Barber

[57] ABSTRACT

Complementary BCD or binary input signals are transferred through isolating optical couplers to storage. Strobing for storage selects network switches to provide an analog voltage corresponding to the digital input. Two independent outputs are provided through repeater amplifiers. One output may be divided by 10 or 20 under signal control. The entire converter is powered from the AC line. Isolation between input and output is maintained up to 1000 volts. The converter is intended for use as a programming voltage for a voltage or current regulated power supply.

12 Claims, 5 Drawing Figures

DIGITAL TO ANALOG CONVERTER

Digital to analog converters are used to convert digitally coded information or commands to the corresponding analog value. One such converter is disclosed in U.S. Pat. No. 3,566,252 in which digital input information is used to close a combination of relay operated switches to control the gain of an amplifier in such a manner as to provide an analog output in accordance with the digital input. While this switched system is capable of high degree of accuracy, the speed of response is limited by the time taken for the relays to respond.

Greater speed and convenience can be attained by using solid state switching. Packaged digital-to-analog solid state converters are available, for example, Model DAC made by Zeltex, Inc., Concord, Calif. provides such fast solid state conversion of binary or binary coded decimal (BCD) digital signals to corresponding analog signals from zero to ten volts. However, such converters are dc coupled providing no isolation between input and output and they have other limitations which are overcome by the present invention.

SUMMARY

One of the important aspects of the present invention is the provision of 1000 volt dc isolation between the input and output while at the same time using only a single line power transformer. This is accomplished largely by means of optical couplers, one for each digit of the input digital information. The dc power on each side of these couplers is supplied from isolated secondary windings of the power transformer.

The input digital signals are inverted before being applied to the optical couplers. This is acceptable to digital systems and it has the unique advantage that if the input digital circuits are open as by failure to connect the input or the input is inadvertently opened, the inputs automatically go to logic 1 but being inverted provide 0 at the output.

Storage means is provided between the optical couplers and the digital-to-analog converter. Input digital information is stored only on command in this storage and is applied to the digital-to-analog converter continuously until the next strobe command. This command is given at an appropriate instant when the desired digital information to be converted is presented to the storage means.

An additional provision is an automatic reset pulse generator which acts when the device is first turned on. This resets all storage cells preparatory to receiving digital information to be processed. Without this provision the storage would contain random information when first turned on and could give a false analog output.

Two outputs are provided from the D/A converter intended for use as reference voltages in bridge circuit voltage/current regulated power supplies. One output is provided directly as a voltage from 0 to 10 volts while the other output is attenuated manually or by means of digital programming signals. Attenuator ratios of 1:1 and 1:10 are available under digital signal control while ratios of 1:1, 1:10 and 1:20 are available by manual control. This attenuated output is useful, for example, as the reference voltage for a current regulated power supply where either 0.5 or 1.0 volt levels are provided across the current sensing resistor.

The digital to analog converter of the present invention is primarily intended as a programming device for bridge regulated power supplies. It is designed to be equally useful for programming voltage stabilized, current stabilized or cross-over power supplies. In other words an interface between digital processing units and a d-c stabilized power supply. The basic D/A converter will be shown and described as well as the modes of use with the three main types of regulated power supplies.

IN THE DRAWING

Figure 1:
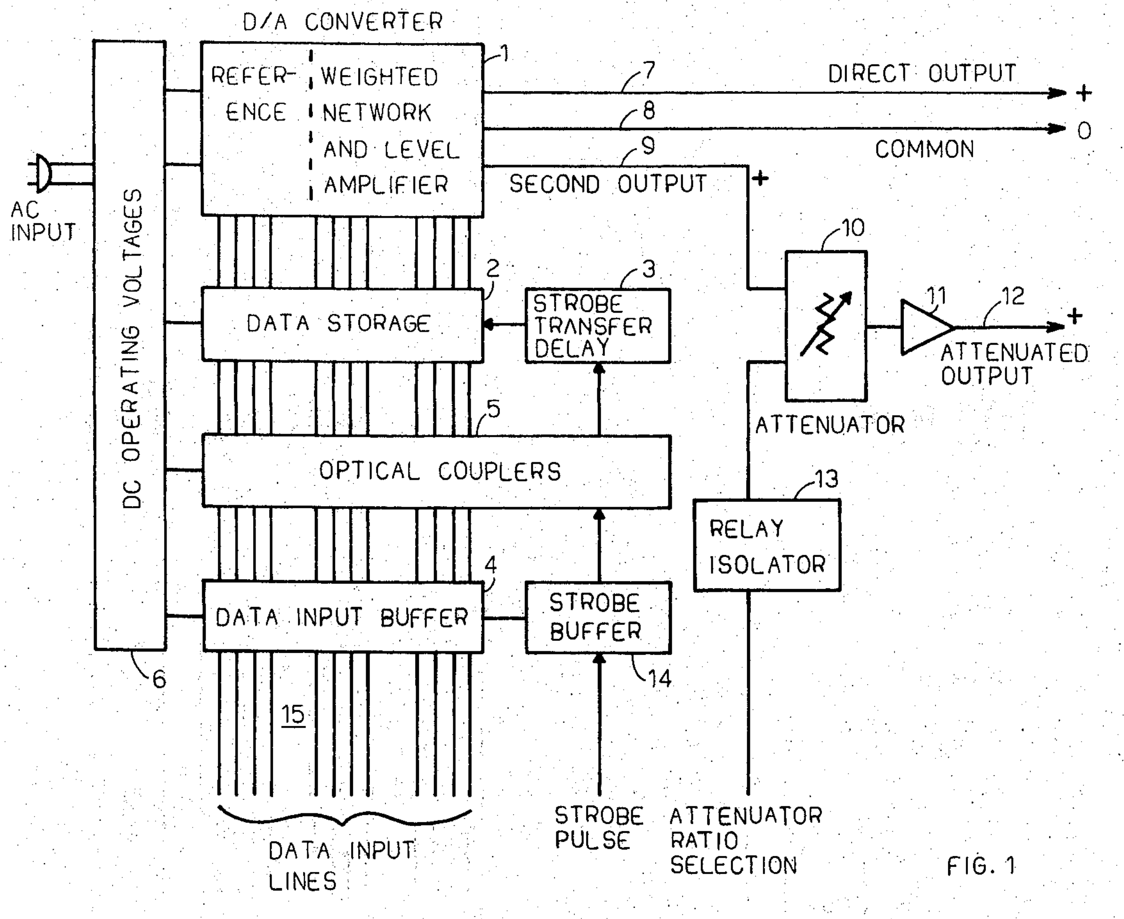
FIG. 1 is a block diagram of the digital to analog converter unit of the present invention.
Figure 5:
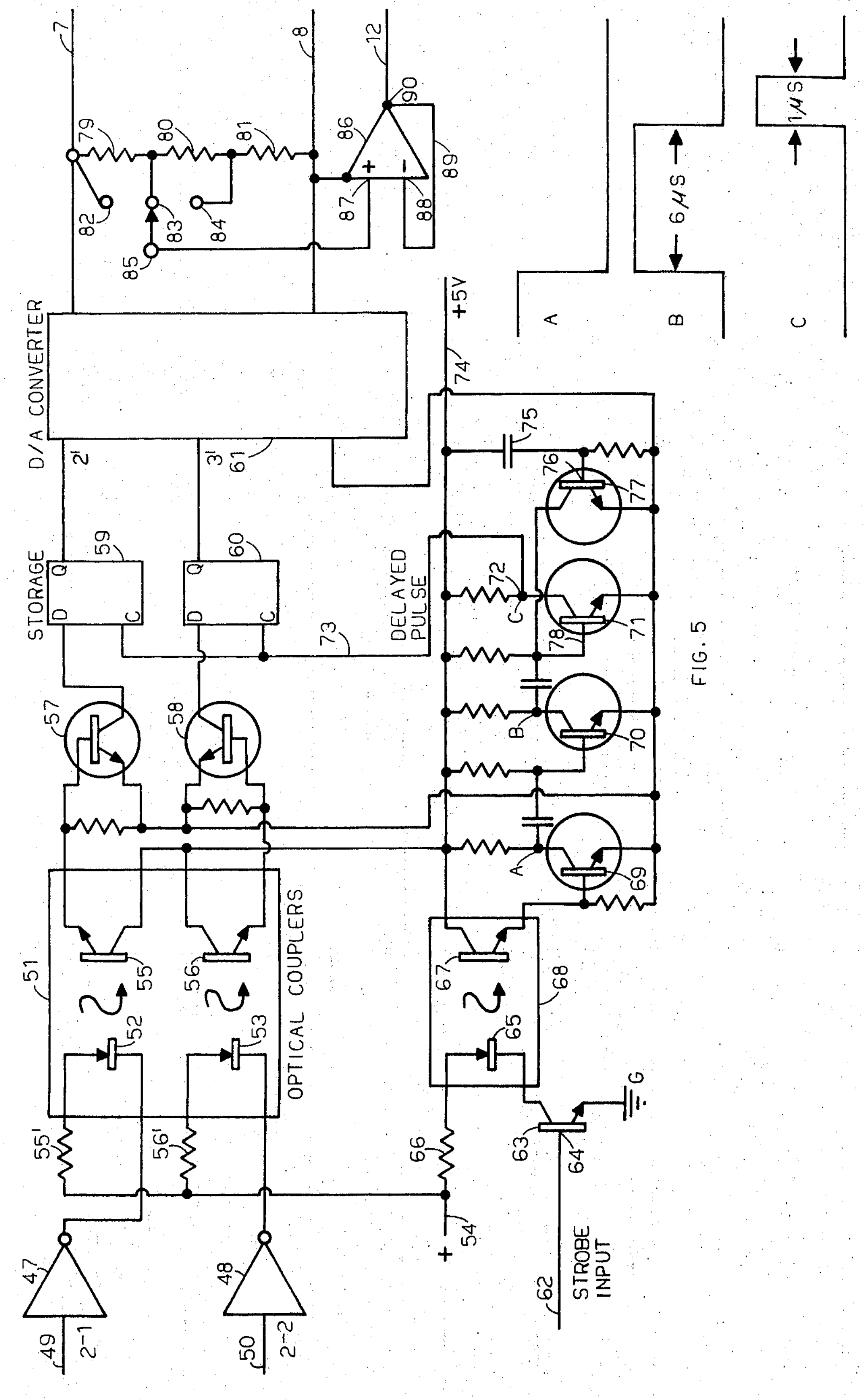
FIG. 5 is a schematic circuit diagram of a portion of the digital to analog converter unit showing optical coupling and other features in accordance with a preferred form of the present invention.

FIG. 1 shows in block diagram form the essential components of the digital to analog converter which is the heart to the present invention. The basic digital to analog converter 1 receives data over a plurality of lines from data storage 2. Data is stored in response to a strobe pulse from strobe transfer delay 3. Data in digital form is applied to input buffers 4 over a plurality of lines and the buffered data is applied to optical couplers 5 which in turn apply the buffered and optical coupler isolated data to storage 2. Twelve lines are shown which are arranged in three groups of four lines. Thus, 12 bit unipolar binary, 12 bit bipolar binary or three digit binary coded decimal data inputs can be accepted. All direct current operating voltages are provided by a line operated power supply 6. Two analog outputs are provided, one a direct output between line 7 and common line 8 and the second between line 9 and common line 8. These two outputs are identical but one is intended for direct use while the second on line 9 is attenuated by attenuator 10, repeated by repeater amplifier 11 and outputted on line 12. The attenuator ratio is controlled by a signal applied to relay isolator 13. The strobe input is buffered by strobe buffer 14. Details of actual circuitry of these various blocks is shown in FIG. 5 and described below.

Describing the operation of the digital to analog converter of FIG. 1; digital data is applied over the parallel data input lines 15 to data input buffer 4. The data is inverted in this buffer as will be explained in detail in connection with FIG. 5 below. The inverted data is applied, still in parallel, to optical couplers 5. There is one optical coupler for each data line so that complete isolation is provided between the input lines and the lines out of the couplers. The isolated data lines next go to the input of data storage 2 where again a storage element is provided for each data line. The input data is stored in the data storage by means of a strobe pulse applied to buffer 14 and, after isolation in an optical coupler, one of the optical couplers 5, the pulse is delayed in strobe transfer delay 3 and applied to data storage 2 which in turn drives the D/A converter 1. The digital data thus applied to D/A converter 1 provides an analog output on lines 7, 8 and 9 corresponding to the input data applied to lines 15. One analog output is direct and appears between lines 7 and 8 while a second and equal output appears between lines 9 and 8. The direct analog output is used directly as will be set forth below while the second analog output is applied to an attenuator 10 capable of providing ratios of 1:1, 1:10 or 1:20 under manual control or under signal control by means of signals applied through relay isolator 13. The attenuated output of attenuator 10 is repeated by unity gain amplifier 11 and outputted on line 12. The application of this attenuated output will be apparent from the descriptions of FIGS. 2, 3 and 4 below.

Figure 2:
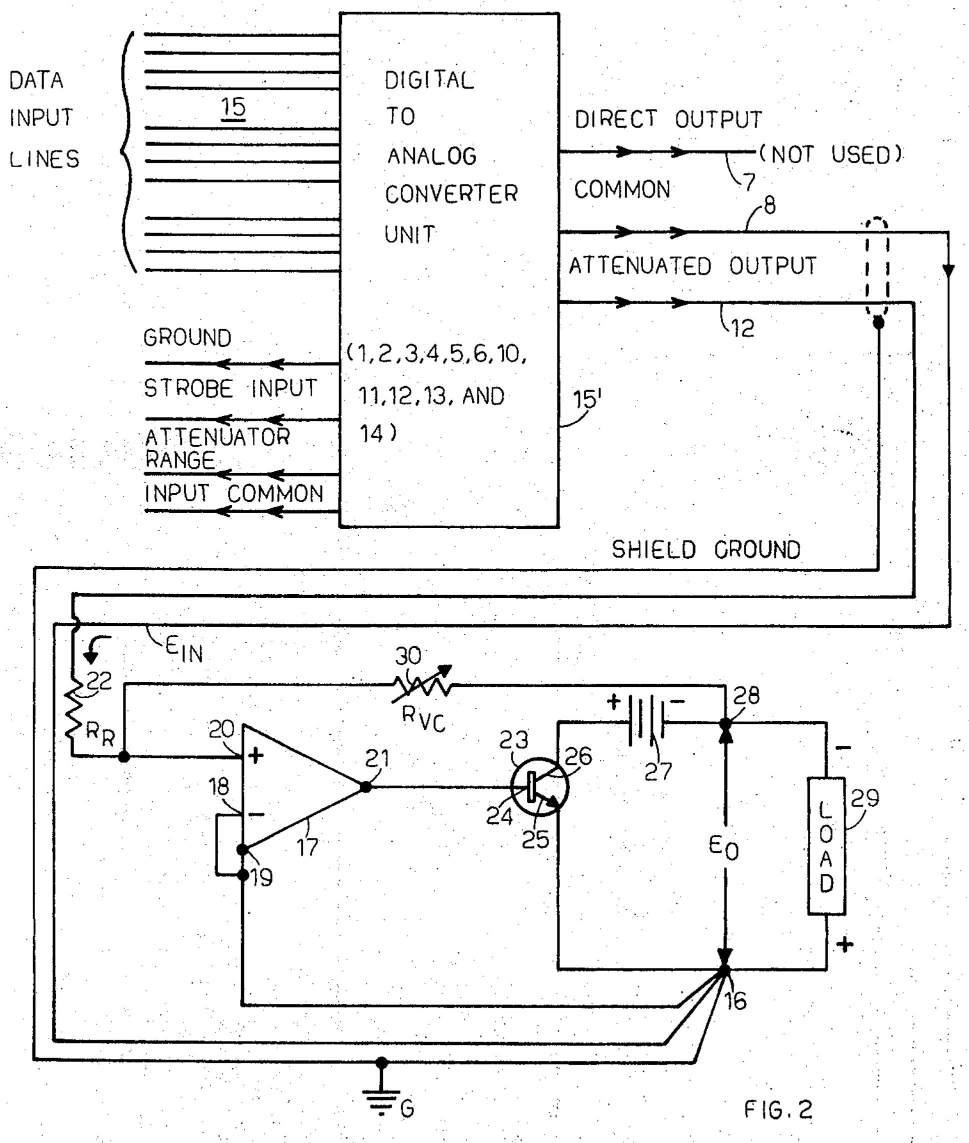
FIG. 2 is a block diagram of the digital to analog converter unit connected to program a voltage stabilized bridge type power supply.

FIG. 2 is a block diagram of the digital to analog converter unit connected to program a voltage stabilized bridge type power supply. All of the digital to analog converter blocks including the basic D/A converter 1, data storage 2, strobe transfer delay 3, data input buffer 4, optical couplers (isolation) 5, attenuator 10, relay isolator 13, and repeater amplifier 11 as shown in FIG. 1 and described above are to be considered internal components of digital to analog converter unit 15'. The input and output lines are the same as those shown in FIG. 1 and described above and bearing the same designations.

The power supply being programmed is a bridge type power supply comprising a non-inverting amplifier 17, a pass transistor 23 which produces a phase inversion, and a source of unregulated voltage 27 all designed to provide a regulated voltage to load 29 under analog signal control from converter 15' which in turn receives input commands. The amplifier 17 includes an inverting input terminal 18 connected to a common terminal 19 and in turn connected to common load terminal 16; a non-inverting input terminal 20 connected through reference resistor ($R_R$) 22 to the attenuated output line 12 (or to direct output 7) of converter 15'; an output terminal 21 connected to base 24 of pass transistor 23; collector 26 is connected through unregulated voltage source 27 to high side terminal 28 of load 29; and emitter 25 is directly connected to common terminal 16 of load 29. Now, it is well known that this circuit (see U.S. Pat. No. 3,028,538) provides an output voltage $E_0 = -E_{IN} \times (R_{VC}/R_R)$ where $E_0$ is the voltage across load 29 between terminals 16 and 28, $E_{IN}$ is the digitally programmed analog voltage, the attenuated output of converter 15', $R_{VC}$ is the resistance of feedback resistor 30 connected between high side load terminal 28 and non-inverting input terminal 20, and $R_R$ is input reference resistor 22.

Figure 3:
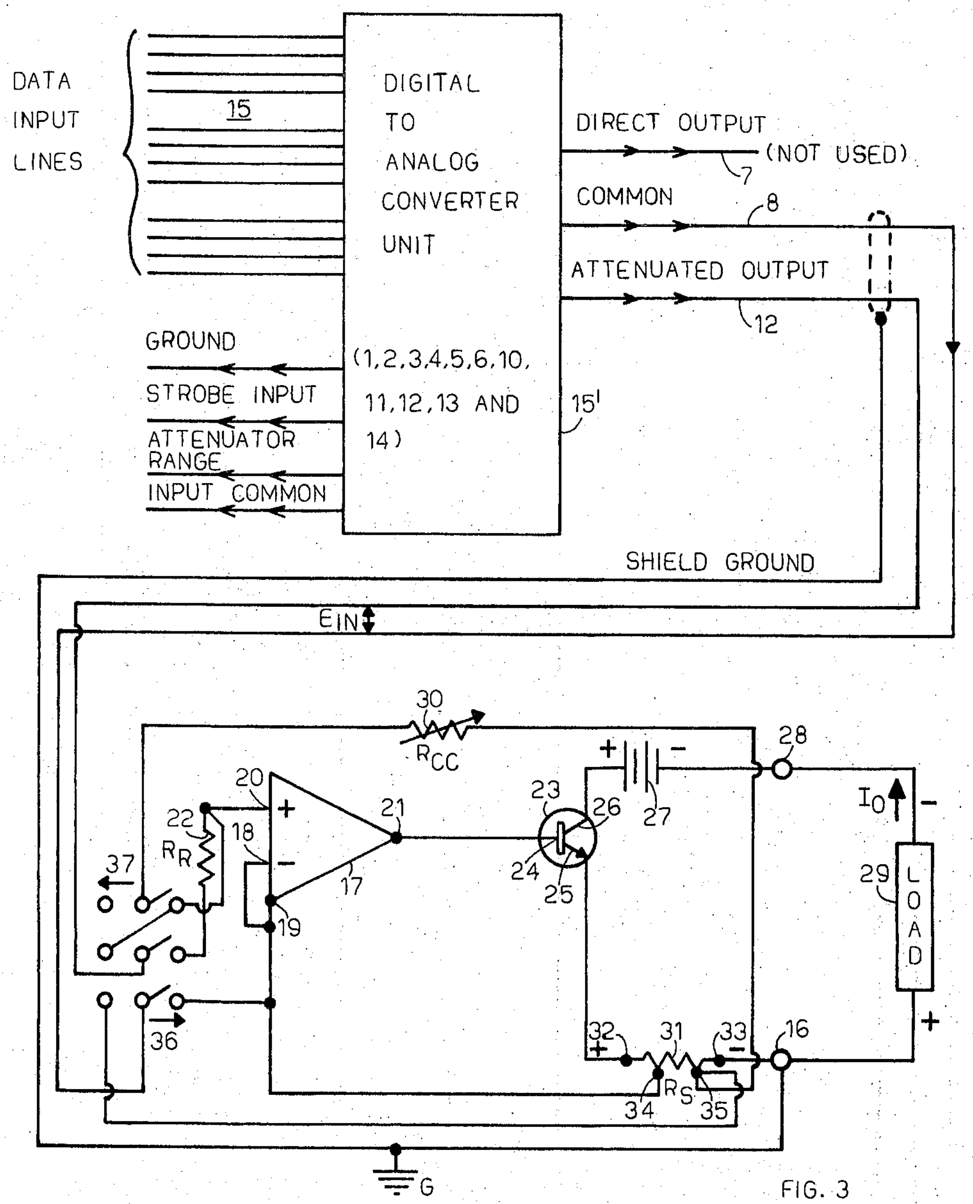
FIG. 3 is a block diagram of the digital to analog converter unit connected to program a current stabilized bridge type power supply.

FIG. 3 is a block diagram of the digital to analog converter unit as set forth above in connection with FIGS. 1 and 2 connected to program a current stabilized bridge type power supply. In this case a current sensing resistor 31 is connected between emitter 25 of pass transistor 23 and common load terminal 16. For precision in sensing the voltage drop due to load current a four-terminal resistor may be used with current terminals 32 and 33 and sensing terminals 34 and 35. Sensing terminal 34 is connected to amplifier common terminal 19 and sensing terminal 35 is connected to one end of feedback resistor 30. In this case resistor 30 can be considered $R_{CC}$ i.e. the current control resistor. When switch 37 is open and switch 36 is closed, the load current in accordance with the bridge formula is determined as follows:

$$-E_{IN}/R_R = I_0 R_S/R_{CC}$$

solving for $I_0$ (load current)

$$I_0 = -E_{IN} R_{CC}/R_R R_S = -E_{IN}\ (R_{CC}/R_R R_S)$$

The input voltage $E_{IN}$ thus controls the output voltage and $E_{IN}$, where the analog voltage is converted from the digital input signals as set forth above.

However, the above equations were set up assuming that the reference current ($E_{IN}/R_R$) is negligible in comparison with the output current $I_0$ and hence is omitted from the computations. In order to program output currents down to low values and without the presence of any reference current, switch 37 is closed, switch 36 is opened. When this is done the input voltage $E_{IN}$ is equal to the voltage drop across sensing resistor $R_S$ so that $E_{IN} = I_0 R_S$ and $I_0 = E_{IN}/R_S$.

Generally, the current sensing resistor is chosen to provide a maximum voltage of 0.5V (for high currents) or 1.0V (for low currents). While in the voltage stabilized connection of FIG. 2, the output voltage of the converter may generally be used directly (10V), the lower feedback voltage of the FIG. 3 current stabilized connection makes the choice of 1:10 (1V) or 1:20 (0.5V) attenuator ratios desirable.

Figure 4:
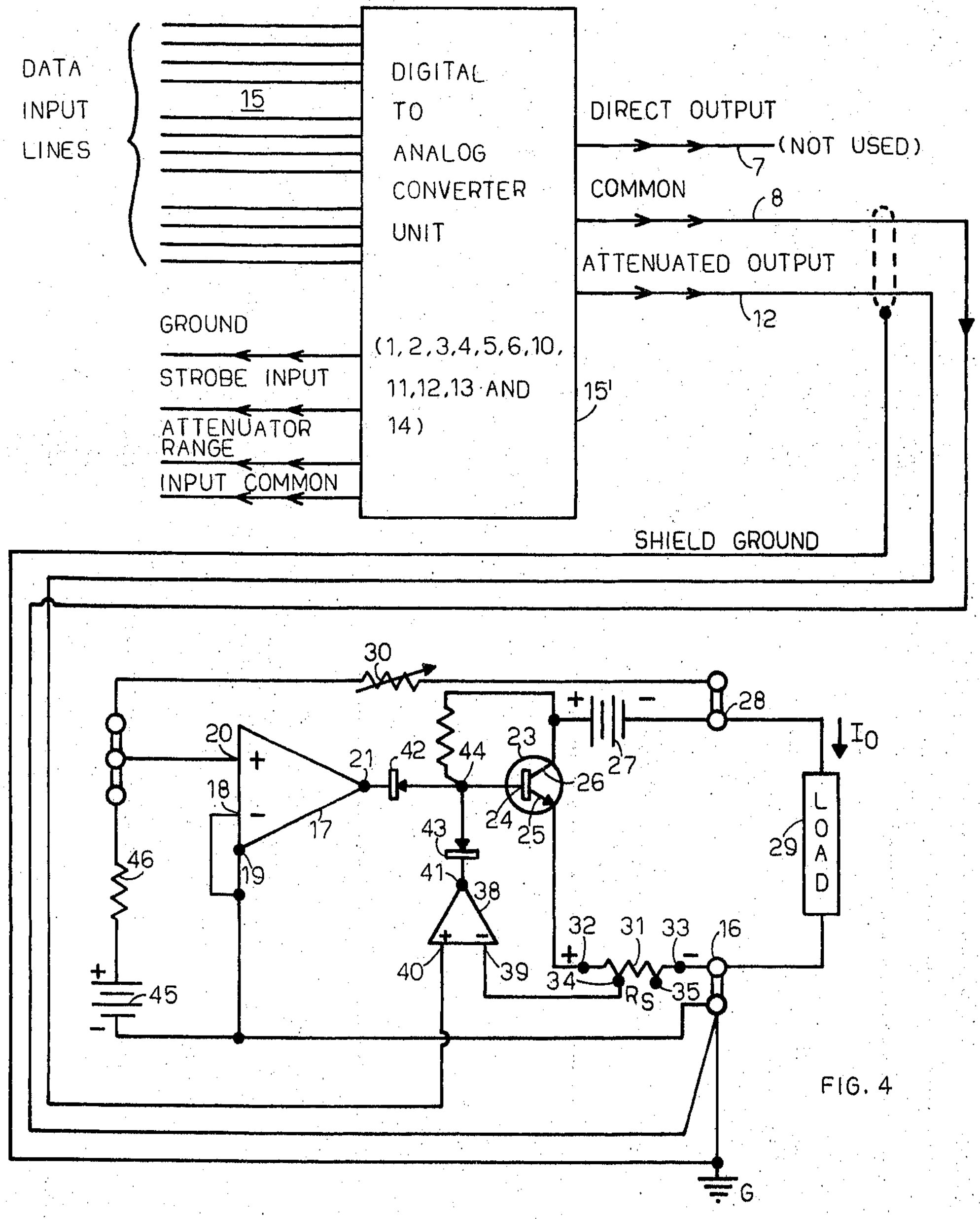
FIG. 4 is a block diagram of the digital to analog converter unit connected to current program a cross-over type power supply.

FIG. 4 is a block diagram of the digital to analog converter unit as set forth above in connection with FIG. 1 connected to current program a cross-over bridge regulated power supply. Numerals corresponding to those shown in FIGS. 1, 2 and 3 designate corresponding components of FIG. 4. In addition, the output voltage control amplifier 17 is set at a predetermined output or load voltage by means of a reference voltage 45 connected through reference resistor 46 to non-inverting input 20 of amplifier 17 and the setting of adjustable feedback resistor 30 which in this circuit acts as a voltage control resistor. This predetermined voltage, for example, may be chosen as the maximum compliance voltage to which the load is to be subjected. In order to permit cross-over control, amplifier 17 is coupled to junction point 44 and thence to base 24 of pass transistor 23 by means of diode 42.

Current programming is accomplished by means of a second operational amplifier 38 which includes non-inverting input terminal 40, inverting input terminal 39 and output terminal 41. Terminal 34 of sensing resistor 31 is connected to inverting input terminal 39 and the programming voltage from the digital to analog converter 15' is connected to non-inverting input terminal 40. Output terminal 41 is connected through diode 43 to junction point 44 and thence to base 24 of pass transistor 23. Amplifier 38 acts to cause the voltage drop across current sensing resistor 31 equal to the programming voltage from converter 15'. This is accomplished by providing an output through diode 43 to base 24 which controls the load current until this equality exists. As stated above the attenuated output of unit 15' which may be set at 0.1 or 0.05 of the full output is provided for this current programming function since current sensing resistors are generally chosen to provide either 1.0 or 0.5 volts for maximum output.

Diodes 43 and 42 act as gates permitting either the voltage amplifier 17 or the current amplifier 38 to control the output. Whichever amplifier is providing the more negative output is in control. The current mode is the normal mode, but if the current amplifier calls for a higher voltage across the load than that set into the voltage amplifier, the voltage amplifier will assume control acting as an over-voltage protector.

FIG. 5 is a detailed circuit diagram of a portion of digital to analog converter unit 15'. While circuits for only two digits of input digital information are shown, the balance of the circuits for any number (8 or 12 typically) may be deduced since these further circuits are merely repetitious of those shown. Input data in parallel format is applied to input leads 49, 50, etc. which applies the data signals to inverters 47, 48, etc. Inverters 47, 48, etc. are connected to drive light emitting diodes 52, 53, etc. which are supplied with bias current from positive bias lead 54 through resistors 55', 56', etc. Diodes 52, 53, etc. excite corresponding light sensitive transistors 55, 56, etc. which in turn drive coupling transistors 57, 58, etc. which again in turn apply on/off signals to the D input terminals of flip-flops 59, 60, etc. The outputs of flip-flops 59, 60, etc. are connected to inputs 2', 3', etc. of D/A converter 61. The D/A converter is a conventional combination of switches and resistors for providing an analog output in response to a digital input such as Zeltex, Inc. Model ZD433. The D/A converter output appears between output lead 7 and common lead 8. The input connections are chosen to accept complementary binary coded decimal signals.

Following the sequence of opertion through one bit path, if a binary 1 is applied to input lead 49, an inverted signal, binary 0, appears at the output of inverter 47 and light emitting diode 52 is energized. With diode 52 turned on transistor 55 turns on as does transistor 57 and a binary 0 is applied to D input of flip-flop 59. When the C input of flip-flop 59 is strobed (see details below), a binary 0 is applied to terminal 2' of D/A converter 61. The result of the output of D/A converter 61 is zero volts between output line 7 and common 8. If the signal on input line had been a binary 0, a binary 1 would have appeared at the circuit points from the output of inverter 47 to input terminal 2' of D/A converter 61 and an analog voltage corresponding to the complement of 0 (i.e. binary 1) on line 49 would have appeared between output line 7 and common line 8. (Light emitting diode 52 would have gone off, transistors 55 and 57 would have been rendered non-conducting, a binary 1 would have been applied to input terminal D of flip-flop 59 and a binary 1 would have appeared at Q output when C input was strobed.) Similarly, the other digital inputs 50, etc. contribute to the analog output. One reason for using complementary binary input is that if no signals are applied as by failing to connect an input device to lines 49, 50, etc. simulating all binary 1's on the lines, the output of the D/A converter will be zero rather than full output. Thus, in such an event any power supply connected to the D/A converter output will be programmed to zero, a safety precaution.

As described above, digital data applied to input lines 49, 50, etc. is inverted and applied to flip-flops 59, 60, etc. These flip-flops act as storage means, holding previously applied data at the output until a change in data is called for. When the new data is present at the input, a strobe pulse transfers it to this flip-flop storage. By this means, the analog output is not changed until called for permitting changes in the input without affecting the output. In order to store the new data, a strobe input line 62 is provided to receive data storing strobe pulses. Input strobe pulses on line 62 are applied to base 64 of transistor 63 which in turn drives light emitting diode 65 receiving bias from bias line 54 through resistor 66. When diode 65 lights, light sensitive transistor 67 is turned on causing transistor 69 to conduct. This pulls down its collector voltage and transmits a level change to the base of transistor 70. Recovery of the capacitor at a time determined by the time constant of the capacitative coupling between transistors 69 and 70 produces a pulse at the collector of transistor 70. This circuit in turn recovers pulsing the base of transistor 71. The resulting pulse at the collector of transistor 71 at junction point 72 is the desired delayed strobe pulse applied over lead 73 to the C terminals of storage flip-flops 59 and 60 causing them to store new data. In order to reset the flip-flops whenever the system is turned on, the positive bus of the system is connected over line 74 and through coupling capacitor 75 to base 76 of transistor 77. The output of transistor 77 is applied to the base 78 of transistor 71 which drives strobe line 73. Thus, whenever the system is turned on, the rising voltage on line 74 and acting through capacitor 75 causes a strobe pulse to appear on line 73 resetting the flip-flops.

As set forth above the analog output converted from the digital input appears between output line 7 and common line 8. This is typically a 0 – 10 volt analog voltage. For purposes of programming current regulated power supplies, full scale outputs of 1.0 or 0.5 volts are desirable. These ranges are provided between attenuated output line 12 and common line 8 by means of a repeater amplifier 86. Operational amplifier 86 includes an inverting input terminal 88, a non-inverting input terminal 87 and an output terminal 90. Inverting input terminal 88 is directly connected to output terminal 90 by means of conductor 89. Thus, output terminal 90 repeats accurately any voltage applied to non-inverting input terminal 87 both in magnitude and polarity. The desired attenuated voltages are provided by resistors 79, 80, and 81 connected in series between output line 7 and common line 8. The desired attenuated voltages are then selected by switch arm 85 placed on any one of contacts 82, 83 and 84. If resistors 80 and 81 are equal and their sum is one-ninth of the value of resistor 79, tap 82 will give full output on line 12; tap 83 will give a 10:1 attenuated output, and tap 84 will give a 20:1 attenuated output.

I claim:

1. In a digital to analog converter, the combination of:

means for receiving in parallel, complementary digital data signals;

means for inverting said signals;

means for isolating said signals comprising a plurality of optical couplers;

strobe responsive means for storing said isolated signals; means for strobing said storing means to store said signals;

means for converting said stored signals to analog signals in accordance with the input data signals;

and means for coupling said analog signals to an output utilization means.

2. A digital to analog converter as set forth in claim 1:

wherein said strobing means includes an optical coupler isolation means.

3. A digital to analog converter as set forth in claim 1:

wherein said strobing means includes strobe signal delay means.

4. A digital to analog converter as set forth in claim 1, and including:

means responsive to the turn-on condition of said utilization means for generating a strobe signal for resetting said storing means.

5. A digital to analog converter as set forth in claim 1:

wherein said isolating means includes optical coupling means.

6. A digital to analog converter as set forth in claim 1:

wherein said output utilization means is a voltage programmable voltage regulated power supply.

7. A digital to analog converter as set forth in claim 1:

wherein said output utilization means is a voltage programmable current regulated power supply.

8. A digital to analog converter as set forth in claim 1:

wherein said coupling means includes an operational repeater amplifier.

9. A digital to analog converter as set forth in claim 1:

wherein said coupling means includes a predetermined ratio attenuator.

10. A digital to analog converter as set forth in claim 1:

wherein said coupling means includes a predetermined ratio attenuator and said output utilization means is a voltage programmable current regulated power supply.

11. In a digital to analog converter, the combination of:

a source of digital data in parallel form to be converted to analog form;

a plurality of strobe responsive storage means each capable of storing one bit of digital data;

a plurality of isolating optical couplers connected in series between said source of parallel data and said storage means for applying said data to said storage;

a source of strobe pulses coupled to said storage means for entering said applied data in said storage means;

digital to analog converter means coupled to said storage means for converting the digital data stored therein to analog form;

and means for utilizing said analog form data.

12. A digital to analog converter as set forth in claim 11:

wherein said source of digital data includes contact means which disconnects said source from said converter;

and wherein the polarity of the converter between said contact means and said utilization means is such that when said contact means is open circuited, the utilization means receives analog zero from said converter.

* * * * *